US007256719B2

(12) United States Patent
Mitchell et al.

(10) Patent No.: US 7,256,719 B2
(45) Date of Patent: Aug. 14, 2007

(54) DIGITAL DATA DECOMPRESSION IMPLEMENTED IN A FIELD PROGRAMMABLE ARRAY DEVICE

(75) Inventors: Joan L. Mitchell, Longmont, CO (US); Phillip K. Hoskins, Berthoud, CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/387,052

(22) Filed: Mar. 23, 2006

(65) Prior Publication Data

US 2006/0214822 A1 Sep. 28, 2006

Related U.S. Application Data

(60) Provisional application No. 60/664,484, filed on Mar. 23, 2005.

(51) Int. Cl.
*H03M 7/40* (2006.01)

(52) U.S. Cl. .......................................... 341/67; 341/50

(58) Field of Classification Search ............. 341/60–90
See application file for complete search history.

(56) References Cited

U.S. PATENT DOCUMENTS 5,650,905 A * 7/1997 Bakhmutsky ................ 341/67
5,757,295 A * 5/1998 Bakhmutsky ................ 341/67
6,157,326 A * 12/2000 Van Der Vleuten et al. .. 341/65

* cited by examiner

*Primary Examiner*—Lam T. Mai
(74) *Attorney, Agent, or Firm*—Whitham, Curtis, Christofferson & Cook, PC.; Dale M. Crockatt

(57) ABSTRACT

Operations for decompression of compressed data is performed in parallel and in a pipelined manner to generate addresses into a memory on-the-fly rather than using a large look-up table. The logic circuits for doing so are thus reduced to the point of being able to be formed by suitable programming of a field programmable gate array (FPGA) while achieving substantial increase in processing speed beyond speed increases attributable to increase of clock rates.

20 Claims, 7 Drawing Sheets

DIGITAL DATA DECOMPRESSION IMPLEMENTED IN A FIELD PROGRAMMABLE ARRAY DEVICE

CROSS-REFERENCE TO RELATED APPLICATIONS

This application claims priority to U.S. Provisional Patent Application 60/664,484, filed Mar. 23, 2005, which is hereby fully incorporated by reference.

BACKGROUND OF THE INVENTION

1. Field of the Invention

The present invention generally relates to decompressing compressed data at high speeds, and, more particularly, decompressing JPEG compressed image data at high speed for image reproduction by printers or displays.

2. Description of the Prior Art

Storage and transfer of data in digital form is becoming increasingly widespread at least because digital signals are less subject to noise, errors can often be corrected, archival storage media are more efficient and economical and electronic infrastructure for transmission and processing of digital data is widely available. However, some types of data, such as image data, when placed in digital form, often requires very large numbers of bytes of data to represent a single image; thus increasing the cost of storage medium or time of transmission which would be required to accommodate such a relatively massive amount of data.

As a solution to these problems, numerous data compression techniques have been developed in recent years. Notably, a technique has been developed by the Joint Photographic Experts Group (JPEG) which has become an industry standard for compression of image data. This technique provides substantial flexibility in controlling the size of the resulting compressed data and maximizes fidelity of a reconstructed image for a given degree of data compression. JPEG can be implemented in either hardware or software or a combination thereof. In general, since data processing for JPEG compression or decompression/reconstruction is relatively complex, special hardware was initially preferred and remains so for some particularly demanding applications such as high-speed printers or copiers or displays, although JPEG is currently more often implemented in software where speed is less critical. However, where speed is critical for image reproduction from compressed data, special purpose hardware remains preferred for decompression.

There are a number of software and hardware solutions that use very different algorithms to manage decompression, all resulting in more memory requirements and larger circuit counts. The first JPEG chip was produced by a startup company, C-Cube, in 1989 and was their stepping stone to MPEG hardware. C-Cube no longer supplies JPEG hardware. Several other JPEG chips previously offered have gone end-of-life and are, in any event, no longer capable of meeting current requirements for processing speed. Moreover, design of application specific integrated circuits (ASICs) capable of required decompression processing speeds is difficult and expensive since they would require a relatively large chip to provide sufficient memory and, since the number of applications requiring exceptional decompression processing speeds are relatively limited, such large ASICs are not considered to be economically feasible at the present time. As an alternative to ASICs, however, so-called field programmable gate arrays (FPGAs) of large size and increased speed have recently become available and FPGAs are available at marginally acceptable cost since they are fabricated in a generalized form that may be freely programmed and thus are applicable to a wide range of applications. such large and high clock speed FPGAs have been investigated for use in high speed image data decompression applications. FPGAs are essentially arrays of various logic gates which may be effectively connected together to perform a desired collective function in accordance with signals stored in a preferably non-volatile memory structure.

Unfortunately, it has been found that the processing for decoding JPEG Huffman codes (and corresponding codes using other compression techniques) could not be accomplished at the required speeds even at the increased clock rates available in current FPGAs. Moreover, the look-up tables used in the process of decoding such codes (which must be alterable) are generally very large and could not be accommodated by smaller and more economically feasible currently available FPGAs.

SUMMARY OF THE INVENTION

It is therefore an object of the present invention to provide an increase in processing speed for decoding of JPEG Huffman codes and corresponding codes under other data compression techniques beyond the increase in processing speed attributable to increased clock rates and which can be implemented on FPGAs smaller than currently available FPGAs.

It is another object of the invention to achieve improved JPEG decompression in a manner and with hardware which is readily adaptable to a number of operating environments. This purpose is achieved, at least in part, by use of a well known industry component, the FPGA, which is well-adapted to the intended purpose of this invention. As such technology is well-known for such generalized FPGA devices, the invention here described may be readily implemented and widely adopted by interested persons.

To accomplish these and other objects of the invention, the invention reduces the amount of memory required for decoding of JPEG Huffman codes by generating indices into the Huffman tables on-the-fly (rather than obtaining them from large look-up tables) to the point that it will fit into a smaller (e.g., less expensive) Field Programmable Gate Array (FPGA), or a smaller ASIC module. In addition, it pipelines the decompression process in such a way as to output one byte (or sample) of data at the fastest clock rate the technology will run. This invention decodes JPEG Huffman code words without using large lookup tables so the design can fit on a FPGA. The decompressor accepts JPEG compressed data, removes the stuffed 0x00 bytes, and then looks simultaneously at all possible Huffman code words and selects which code length N applies. At the same time (i.e., in parallel) the decoder generates all sixteen possible indexes into the Huffman symbol table, one for each possible code length. Once the code length N has been determined, it selects the index. The decoded JPEG RS symbol for that code length is found in the Huffman symbol table created from the JPEG Define Huffman Table marker. At the same time the code length N is used to shift the input compressed data past that code word to the "extra bits" that determine the nonzero quantized transform coefficient value. (4 bits of zero coefficient run count and 4 bits of the number of extra bits needed to create the actual nonzero transform coefficient.) The size of extra bits (0-11) is taken from the low 4 bits of the Huffman table output and used to generate the quantized coefficient. While the invention is here disclosed with reference to JPEG Huffman tables, it can be used with other canonical Huffman tables. Special cases for 1-bit and 2-bit code words guarantee that a 1-bit code can be handled in one cycle, a two-bit code can be handled in two cycles, and all other codes (3-32) are handled in three cycles.

The scaled quantization table data has the JPEG quantization table values pre-scaled to an appropriate value ro prepare for the Scaled Inverse Discrete Cosine Transform (IDCT). This data is then multiplied by the quantized coefficient and unzigzaged by storing it per the zig-zag table. These dequantized transform coefficients are then run through the column and row one-dimensional (1D) Inverse Discrete Cosine Transform (IDCT) to produce reconstructed image data.

In summary, to achieve the above and other meritorious effects, a method is provided comprising steps of receiving an input stream of bits, performing a comparison to determine code word length, performing an addition of an offset and a number of bits of said bit stream in parallel with the step of performing a comparison, selecting a result of the step of performing an addition, and discarding a number of bits of the bit stream equal to the length of said code word upon completion of the step of performing a comparison and an FPGA which can be so programmed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
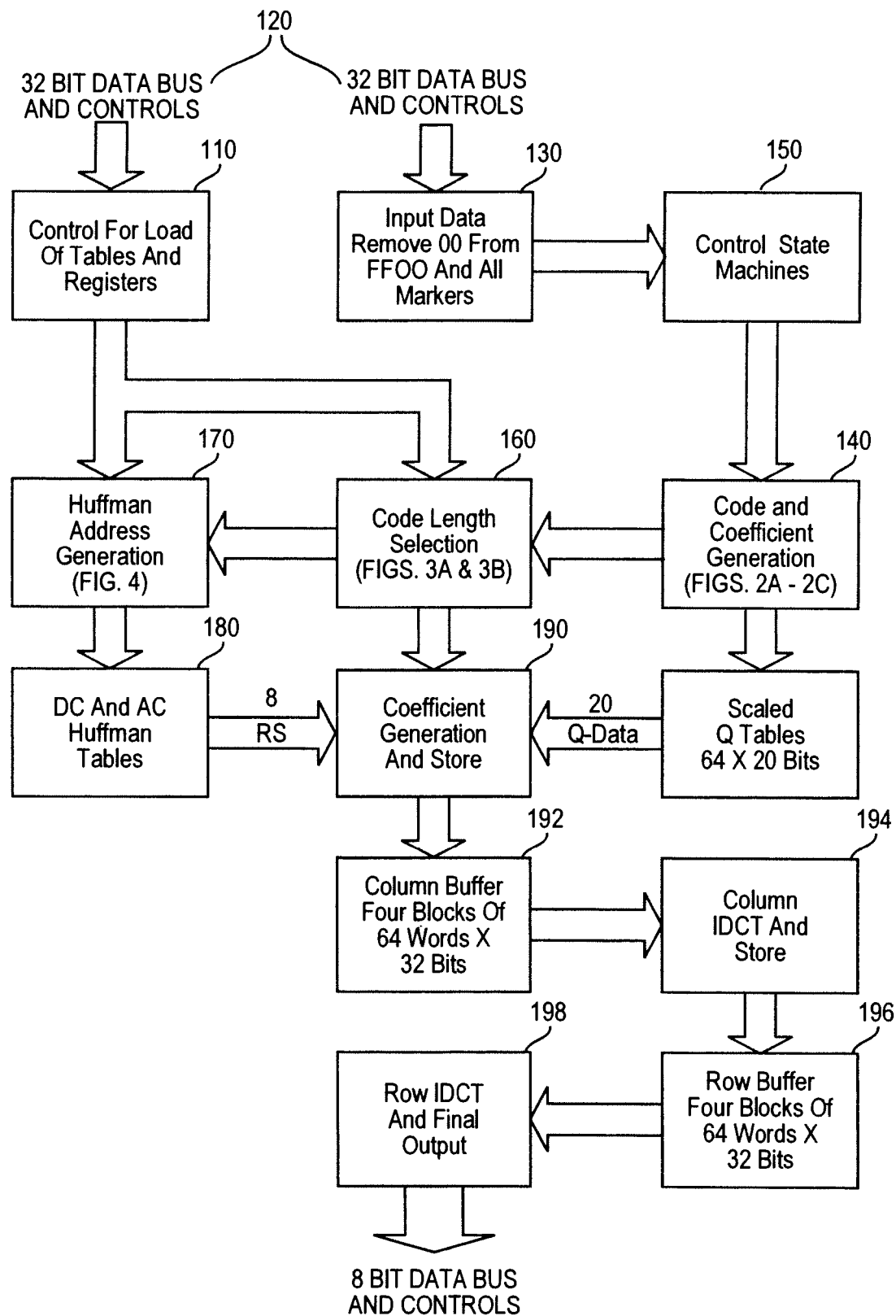
FIG. 1 is a block diagram illustration of a device in accordance with this invention.

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results and meritorious effects of the invention. Accordingly, the description which follows is to be understood as being a broad, teaching disclosure directed to persons of skill in the appropriate arts, and not as limiting upon the present invention.

JPEG Huffman coding is designed as a "canonical" Huffman code. This means that the N-bit prefix for code words whose lengths are longer than N is mathematically greater than all code words of N or less bits. (Note that this assumes a convention that the shortest code word starts with a zero. The inverse would be true if the shortest code word started with a one.) This characteristic of canonical Huffman codes allows the number of bits in each code to be determined from the boundaries of each code word which is , in turn, determinable from the bits of the code even when the code boundaries are not indicated in a continuous stream of bits. The invention exploits this characteristic using parallel comparison on a number of contiguous bits sufficient to contain a code word of maximum length. This assumes that the comparison is made on codes that are left justified in the N-bit register and arbitrary bits from the following compressed data pad the shorter codes out to N bits of length. This canonical format allows the Huffman codes to be generated from the 16 values (Li) that tell the number of code words with lengths i (e.g. the number of code words of each respective bit length where i=1, 2, . . . 16) and the table of up to 256 bytes containing the actual symbols. This information is sent to the decoder via the JPEG Define Huffman Table (DHT) marker (see pages 116-117, 392-394 in JPEG: Still Image Data Compression Standard, Pennebaker and Mitchell, Van Nostrand Reinhold, New York, 1993) which is hereby fully incorporated by reference.

JPEG Huffman codes tend to have more and more leading '1's as the code words get longer as illustrated in the exemplary DC and AC Huffman tables on pages 509-517 of the above incorporated text. Note that the JPEG codes are designed to never use the all '1's code. This is an illegal code and makes identifying the next marker easy because markers always start with a 0xFF byte. Since JPEG code words could accidentally generate these 0xFF bytes, each such byte in the entropy-coded data has a 0x00 byte stuffed after it. These stuffed bytes need to be removed before entropy decoding.

A prior patent owned in common with the present subject invention is Mitchell et al., U.S. Pat. No. 6,373,412, hereby fully incorporated by reference which discloses fast parallel JPEG Huffman decoding. The Huffman decoding piece of the present invention improves upon this prior disclosure. The prior disclosure shows determining the code length N of the Huffman code by comparing in parallel the 1 to 16 bits of the compressed data against the 1 to 16 bit prefixes to the next code length larger than the 1 to 16 bits. The present invention recognizes that only the trailing 8 bits of each code could be anything except a 1. This allows cutting down on the size of the comparators by confirming that the leading bits are 1 and comparing only the final 8 bits for potential codes greater than 8 bits.

The prior disclosure also calculates an index once the size of the code word is known as a following serial operation. The present invention calculates all 16 possible indices in parallel with determining N with minimal hardware well within the capacity of available FPGAs. Again, this invention is able to take advantage of the fact that the output index could be at most 8 bits for baseline JPEG and uses a modulo 8 bit calculation for lengths greater than 8. The pre-computed offsets into the Huffman table are different than that proposed in previously mentioned U.S. Pat. No. 6,373,412 for N larger than 8.

The prior disclosure further assumed that the AC and DC tables were independent. This invention loads the symbols in the DC table found in (e.g. identified by) the DHT marker into the first table positions and then immediately follows them by the symbols in the AC table with the same name. (JPEG Huffman tables are numbered 0, 1, 2, or 3. Only 0 and 1 tables are allowed in the JPEG baseline.) The DC table space was added to the AC pre-computed offsets. The allocated space was fixed at 256 bytes. Since the AC table for baseline Huffman needs less than 160 bytes and the DC table takes at most 11 bytes, this is not a severe restriction. To handle 12-bit raw sample data (e.g. medical images), the offsets need to be calculated modulo 9 bits and the table extended to 272 bytes. The parallel decoding of the symbol length and calculation of the index in accordance with the present invention can be modified. For example, the indices for only the short code lengths could be calculated in the first cycle. Longer code words could be computed serially after the length is known in a shared modulo adder. It is assumed that there is a processor or other hardware that interprets the JPEG markers. This processor pre-computes from the Define Huffman Table (DHT) marker the constants needed to decode the Huffman codes and loads the Huffman symbol table. It also pre-computes from the Define Quantization Table (DQT) marker the quantization Q values in zigzag order and loads scaled versions of the quantization values. The entropy-coded data following the Start of Scan marker is fed into the FPGA for decoding.

More specifically, FIG. 1 shows a component (e.g. hardware of the FPGA programmed to perform a function), "Control For Load of Tables and Registers" 110, where the pre-load is done. The same 32 Bit Data Bus and Controls 120 is where the first stage of the invention brings the compressed data in and removes the stuffed 0x00 bytes that follow any 0xFF byte in the JPEG entropy coded data (130) and presents this data to the Code and Coefficient Generator (see also FIGS. 2A, 2B, and 2C) 140. Code and Coefficient Generator 140 is controlled by Control State Machines 150. The Code Length Selection component 160 (shown in more detail in FIGS. 3A and 3B) feeds the number of bits N in the Huffman Code into the Huffman Address Generation 170 (shown in greater detail in FIG. 4). The address indexes into the DC and AC Huffman Tables 180 and outputs the Run/Size (RS) byte. The Coefficient Generation and Store component 190 uses the high order R nibble (4 bits) to skip over runs of zero coefficients. The low order S (4 bits) nibble allows S bits to be pulled from the compressed data. Details of the format for the coding of the extra bits can be found in the above-incorporated JPEG book by Pennebaker and Mitchell.

The column buffer 192 holds four blocks of 8×8 coefficients arranged into vertical columns per block. The Column IDCT and Store 194 does the Inverse discrete cosine transform (IDCT) on columns and writes them into the Row Buffer 196 which can contain Four Blocks of 64 Words×32 Bits per block. The Row IDCT and Final Output block 198 is similar to the Column IDCT and Store except it outputs the final rounded 8-bit reconstructed image values.

Figure 2:
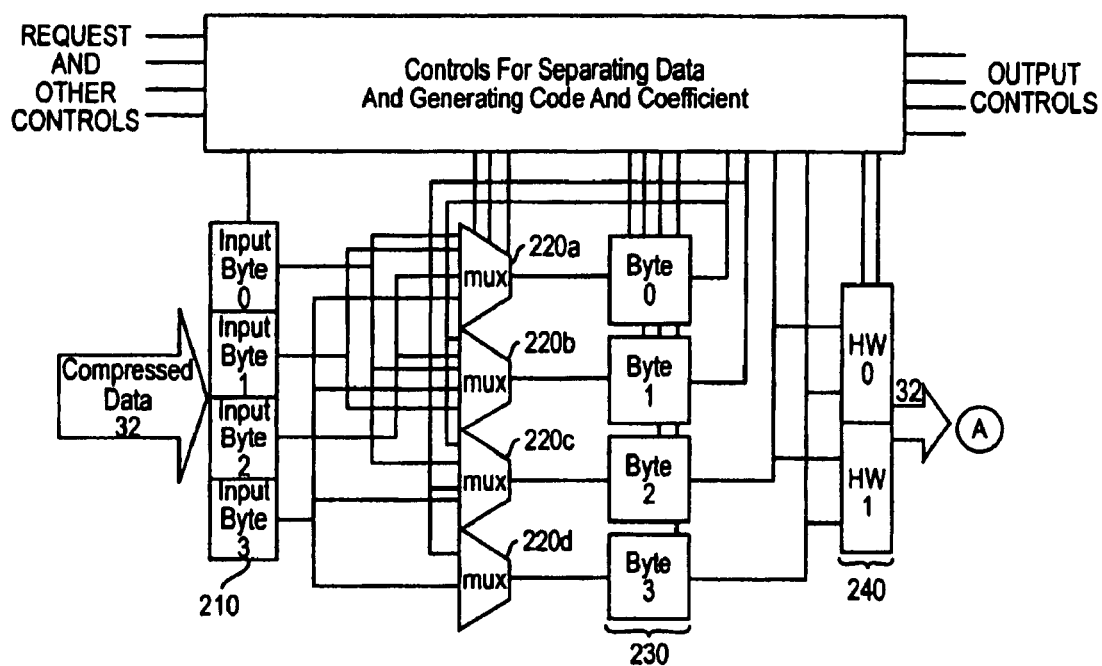
FIGS. 2A, 2B, and 2C show details of one portion of the device of FIG. 1, particularly a portion which performs decode and coefficient generation.
Figure 2B:
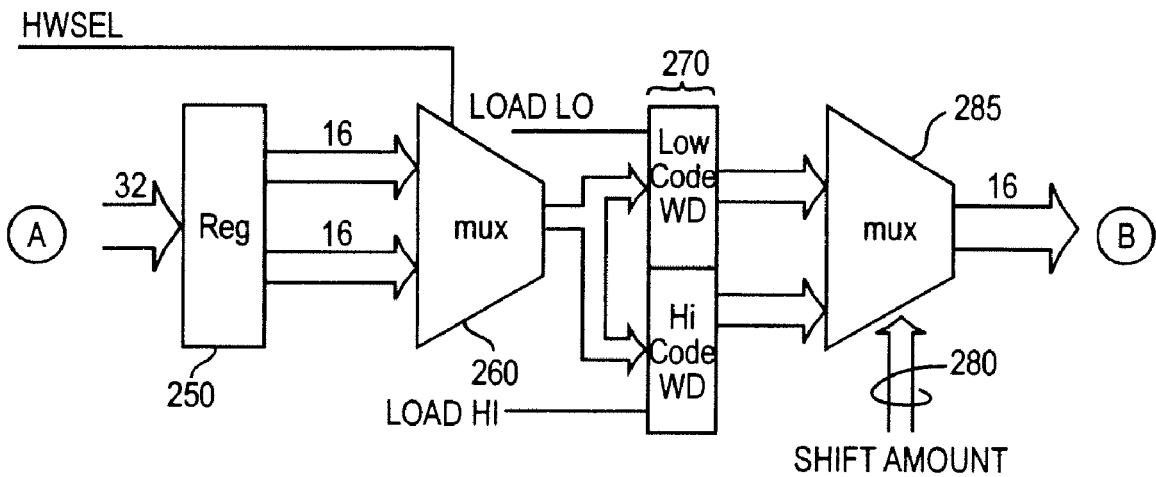
Figure 2C:
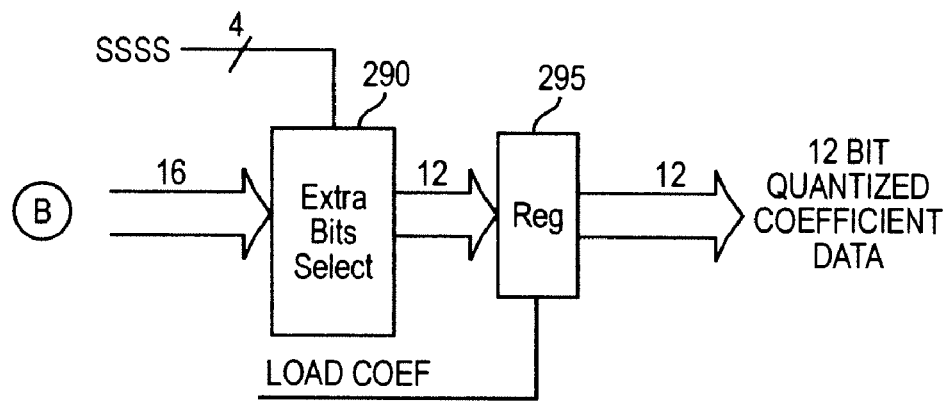

FIGS. 2A-2C constitute the code and coefficient generation component 140 of FIG. 1 discussed above. It should be appreciated that the collective function of the components shown in FIGS. 2A and 2B is to simply manipulate the data rapidly and in parallel into a form which can be serially shifted as variable length code words are identified while always keeping sixteen bits left justified and available for decoding. FIG. 2C extracts extra bits from the bit stream when a decoding operation indicates that following bits are to be so identified and processed as such.

FIG. 2A is a simplified schematic of components which can be developed on a FPGA that shows how the 32-bit Compressed Data can be left justified on halfword (i.e., two byte) boundaries into HW0 in one cycle and new data ready in HW1 at the output (A). A 32-bit input word "Compressed Data" is loaded into a 4 byte register 210 and latched. The top two MUXs (220a, 220b) feed Byte 0 and Byte 1 latched in registers 230 back into the bottom two MUXs. There are many ways known to those skilled in the art to take in four bytes of new input into a register, then with four bytes of internal registers being able to shift by the bytes in one cycle so that the output has four bytes of compressed data ready for the up-to-sixteen bit shifts. The output of the bottom two MUXs (220c, 220d) are loaded into the HW0 or HW1, both of which are 16 bit registers. Together they create a 32-bit output register 240 of which at least 16 bits must be unused at any given time as selected preferably by the components developed in accordance with FIG. 2B.

FIG. 2B illustrates how the 32-bit output from register 240 is latched into a register 250 which provides stable input into a MUX 260 which selects either the high or low 16 bits of register 270. The SHIFT AMOUNT selection data 280 into the MUX, the derivation of which will be explained below, left-justifies the next unused (e.g. not yet used, following a previous code word) compressed data 16 bits for output at (B).

FIG. 2C shows how this data from (B) is fed into the Extra Bits Select block 290 of which at most 12 bits are selected in accordance with the size nibble, SSSS, of the R/S byte developed by decoding the previous code word. The data is latched into a register 295 on the "LOAD COEFF" signal and output as 12-bit quantized coefficient data.

Figure 3:
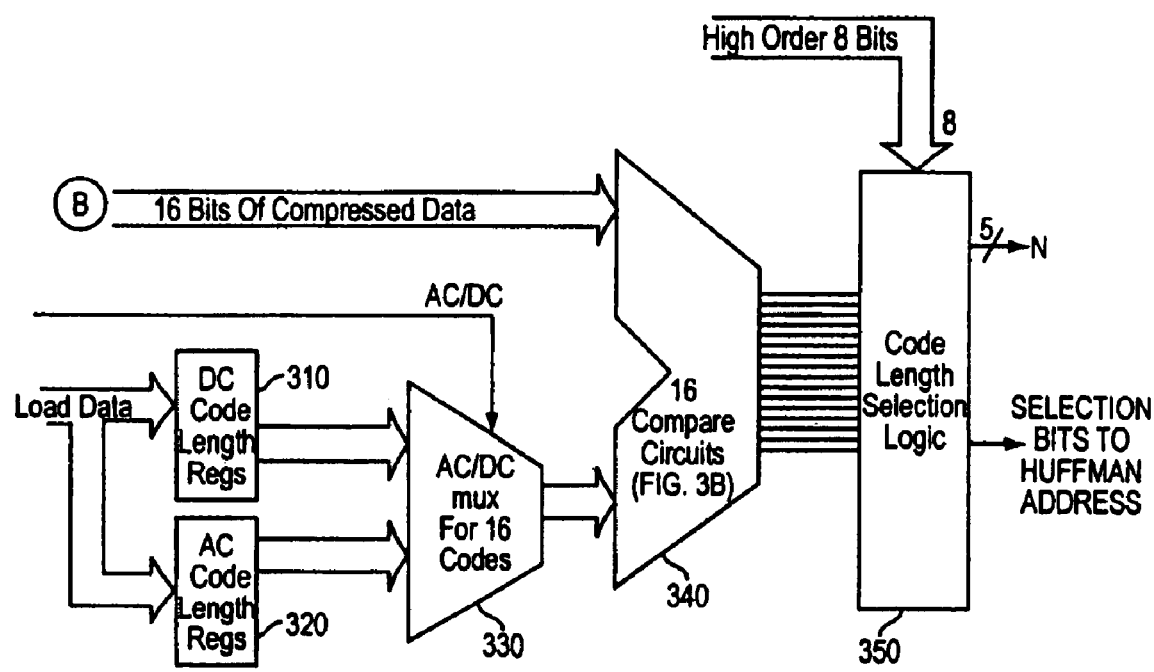
FIGS. 3A and 3B show details of one portion of the device of FIG. 1, particularly a portion which performs code length selection.
Figure 3:
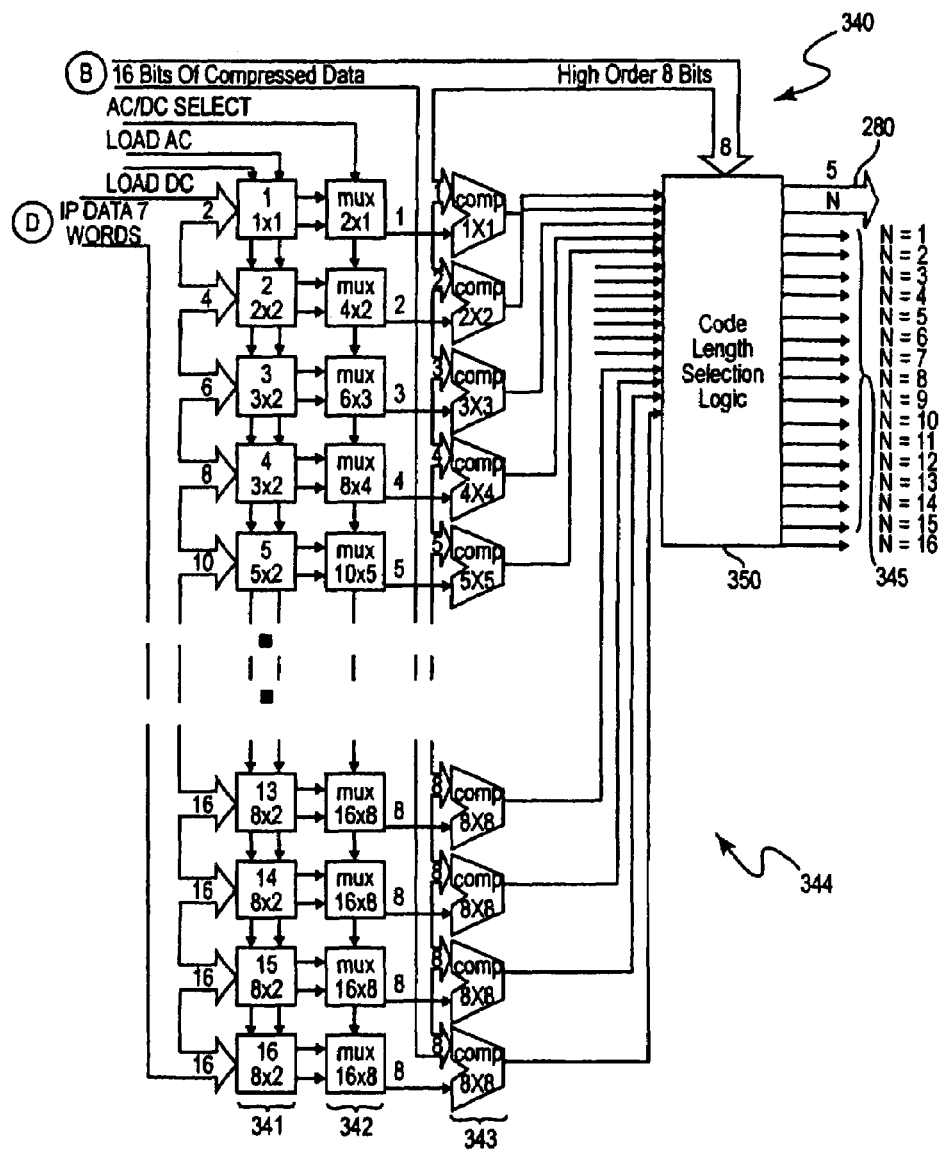

The 16 bits of compressed data output at (B) from FIG. 2B is also input into FIG. 3A, a portion of which is detailed in FIG. 3B. Sixteen DC Code Length Regs 310 or sixteen AC Code Length Regs 320 which have been pre-loaded from the Load Data are selected by the AC/DC control line communicating a signal from the processor. (In accordance with the JPEG standard, the first coefficient of a block will be a DC coefficient and the remainder will be AC coefficients but other conventions could be employed.) These coefficients are selected in accordance with whether AC or DC coefficients are expected in the data stream and are input into the sixteen Compare Circuits 340 at (D) (see FIG. 3B) and compared to the next 16 bits of unused (e.g. not yet used) compressed data input at (B). As illustrated in FIG. 3B, it is preferred to latch both AC and DC coefficients in registers 341 and selectively deliver them to comparators 343 using multiplexers 342. The outputs of comparators 343 are single-bit lines which indicate if the pre-loaded values are more than the comparison values. If so in any given comparator 343, then number of bits in the code word N is larger than that particular comparison. The transition from false to true among the comparator outputs 344 indicates the size of the code word. This is determined using the high order 8 bits of the 16-bits being compared and the results of the compare circuits. Doing so allows the comparators 343 to be constructed of fewer logic elements of the FPGA. Also, this operation, testing for all zeros allows decoding of an all zero code word in a single cycle since a coded zero will be decoded as zero.

The transition from true to false (e.g. the transition between comparator outputs which are "1" and outputs which are "0" of which there will be only one, is readily transformed into a one-of-N code output on lines 345 and a 5-bit code 280 representing the same number, N, which is fed back to multiplexer 285 of FIG. 2B, discussed above. The 5-bit N value containing N=1-16 (or outputs 345 depending on preference for the form of an address selection multiplexer 450 of FIG. 4) is output along with a selector to the Huffman address generation block/component 170 of FIG. 1.

In summary of FIGS. 3A and 3B, the details of the preferred form of the sixteen comparison circuits as well as a repeat of the Code Length Selection Logic 350 receiving the outputs thereof is shown in FIG. 3B. Some important novel elements are present and should be noted. At initialization time, registers are loaded with an interleave of the DC and AC comparison values. So the top 1-bit length comparator has to look at one bit either for the DC or AC code. The MUX 342 selects between the two input bits from registers 341 to create the one output bit. It was originally expected that the loaded input would progress from 1 bit to 16 bits. However, on FIG. 3B no more than 8 bits are needed even though the code words progress up to 16 bits. This is due to the fact that, at most, only the low order 8 bits can be anything but all 1s (or all 0s depending on convention). The High Order 8 Bits input into the Code Length Selection Logic are used to confirm that the N-8 high order bits are all 1s at code length selection logic 350. Doing so significantly simplifies the decoding to derive outputs 280 and 345 therefrom. Table 1 shows the savings in bits from not having to pre-load, recognize, or compare more than the low 8 bits out of the up to 16 bits.

TABLE 1

Savings from comparing no more than 8 bits.

| Code Length | N Bits Compared | Savings |
|---|---|---|
| 1 | 1 | 0 |
| 2 | 2 | 0 |
| 3 | 3 | 0 |
| 4 | 4 | 0 |
| 5 | 5 | 0 |
| 6 | 6 | 0 |
| 7 | 7 | 0 |
| 8 | 8 | 0 |
| 9 | 8 | 1 |
| 10 | 8 | 2 |
| 11 | 8 | 3 |
| 12 | 8 | 4 |
| 13 | 8 | 5 |
| 14 | 8 | 6 |
| 15 | 8 | 7 |
| 16 | 8 | 8 |
| Total: 136 | 100 | 36 |

Figure 4:
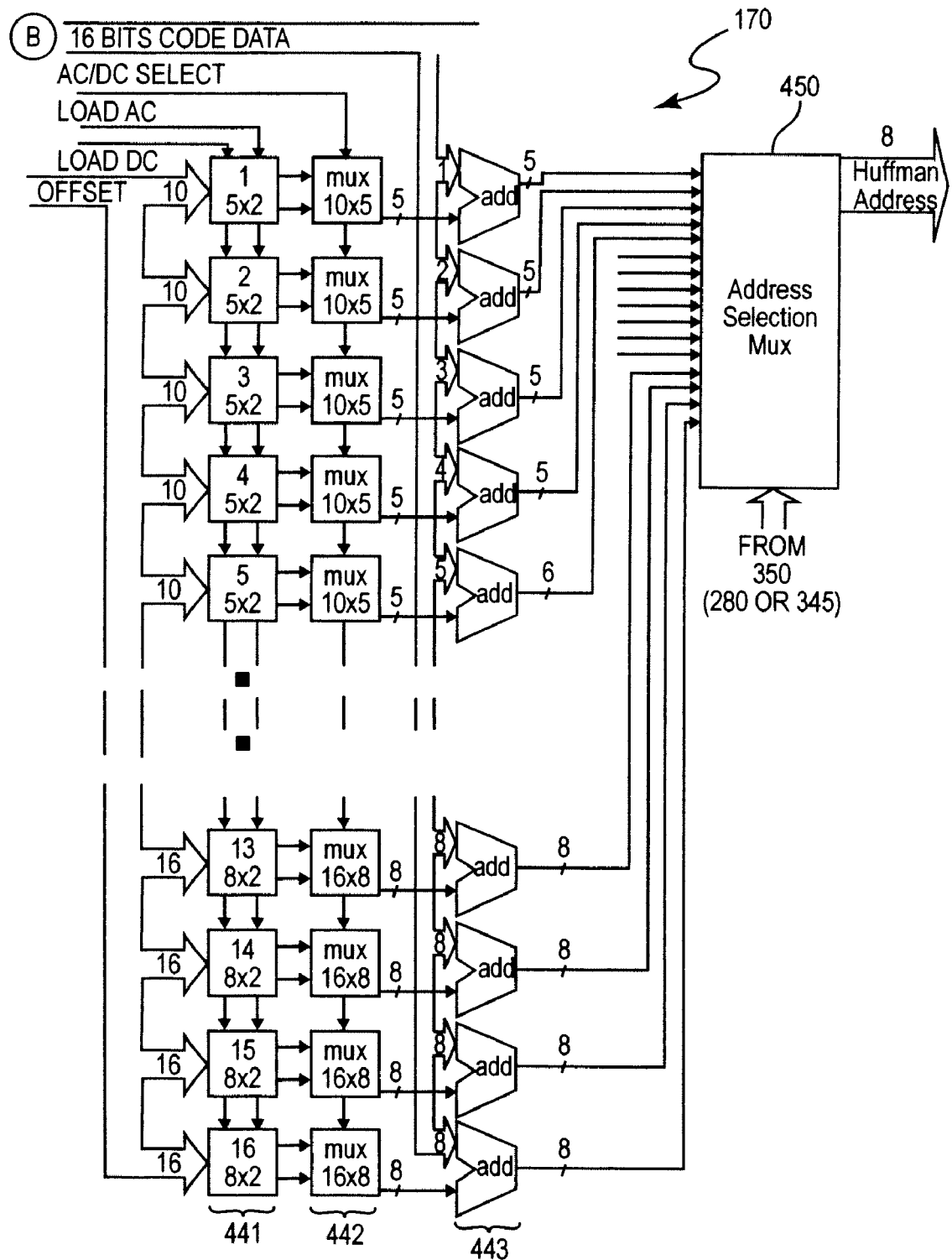
FIG. 4 shows details of one portion of the device of FIG. 1, particularly a portion which performs parallel implementation of Huffman Address Generation.

FIG. 4 shows the parallel implementation of the Huffman Address Generation 170. It will be appreciated that FIG. 4 is organized similarly to FIG. 3B (simplifying programming if implemented with one or more FPGAs as is preferred) with the principal exception of utilizing adders 443 instead of comparators 343 and deriving inputs (D) thereto from latches 441 using multiplexers 442 of AC and DC offsets which correspond to particular Huffman tables rather than code word boundaries. The same 16-bits of Code Data (i.e. compressed data (B)) are input into respective adders 443. The identical logic is used to pre-load the offsets which will be selected by the Load AC or Load DC lines. One other difference is that since the DC and AC tables are packed into the 256 byte buffer, the offsets are a minimum of 5 bits each. The largest offsets allow the AC indexes to skip over the 11 DC entries. Depending upon the value of N determined in the Code Length Selection Logic 350, the Huffman address is selected and output from address selection multiplexer 450. That is, the provision of the offset values and the parallel addition at adders 443 computes sixteen addresses, only one of which will be appropriate for the code word length and which correct address will be selected based on the output from code length selection logic 350. If outputs 280 are used, a simple array of AND gates will form a suitable selector. Alternatively, if outputs 345 are utilized, the multiplexer could, for example, be much in the form of a cross-bar switch.

Figure 5:
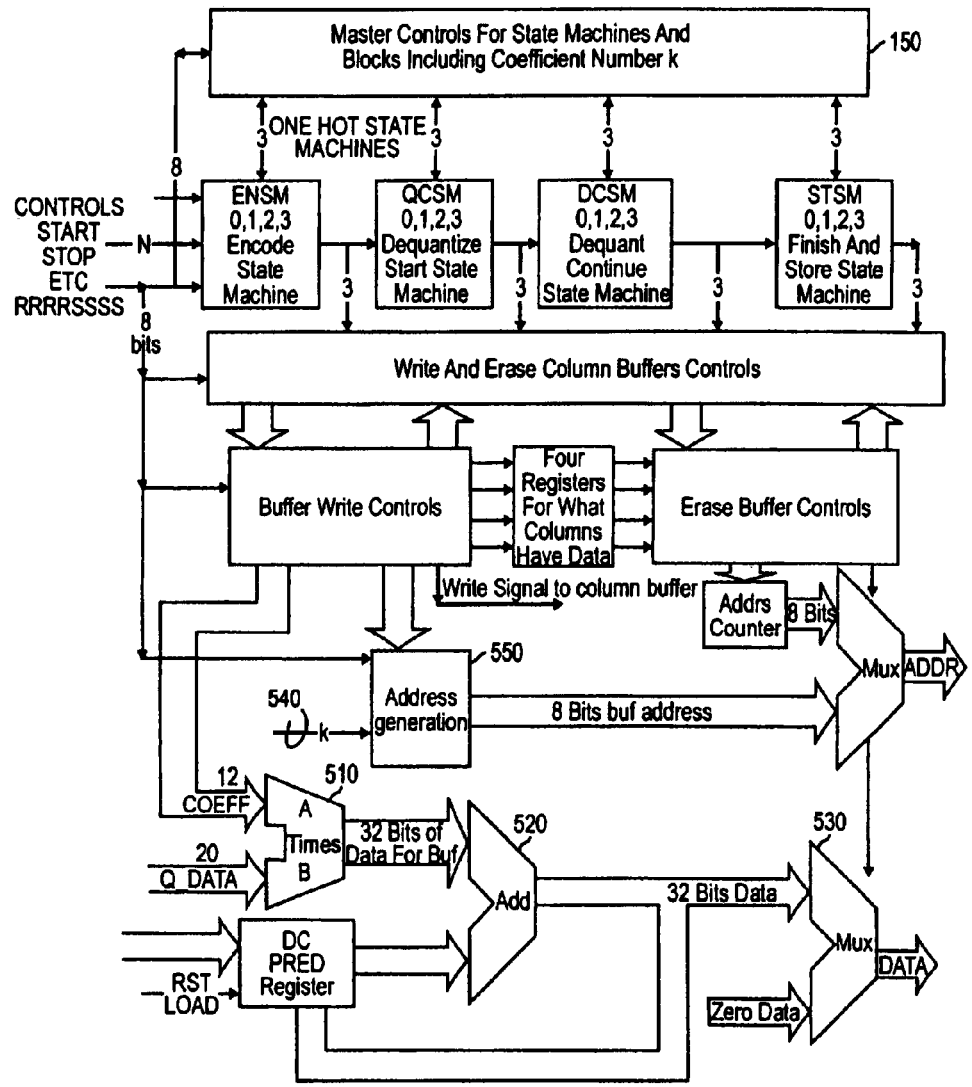
FIG. 5 illustrates the controls and input into an IDCT Column Buffer.

FIG. 5 gives more information about the controls and input into the IDCT Column Buffer discussed above in connection with FIG. 1. At the same time the code length was being generated, the Quantization data was being read from the Q-table dependent on the k (number of the 0-63 coefficients possible in a block) for this coefficient, this is tracked in the control logic and a zig-zag table, and thus when the coefficient is finished, the quantization data is ready also. The Coefficient is multiplied by the quantization data in the A Times B block 510 and then, if it is the DC term (k=0), the DC Pred value (i.e. the previous DC coefficient) is added at 520. The output of the addition is the dequantized scaled DC coefficient. It is stored in the DC PRED register 540 as well as input to the Mux 530. The Add 520 is controlled by a DC/AC select line ((not shown in FIG. 5). When the coefficient is the DC difference, the addition occurs in order to pass on the DC difference plus DC PRED value. When the coefficient is an AC, Add 520 just passes on the output from A Times B 510. The DC PRED is normally the last DC output for the same image color component. However, after a JPEG RESTART Marker code, the value is re-initialized. The DC PRED Register is preloaded with a value that precompensates for the level shift and the rounding constant each time the RST LOAD line resets the register. Since a scaled DCT is being used, the level shift and rounding constants are also scaled so that after the IDCT calculations they are in the correct units. For an original input to the Forward DCT of 8 bits, this reset value is the scaled DC quantization value shifted left by 15. The output of the Add 520 is the non-zero DC or AC coefficient according to when the run counter hits zero (not shown). The run counter is set from the high nibble of the RS symbol output from DC and AC Huffman tables 180 in FIG. 1. The run is the number of zero coefficients before the next non-zero coefficient. The results are stored per the contents of the zig zag table (e.g. the k input 540 into the Address Generation 550 is used internally to index into the zig-zag table and generate the address in one of the four possible block buffers in the Column Buffer. The value 540 of k is increased by the upper nibble of the Huffman data plus one. The lower nibble was used in FIG. 2C to create the output 12 BIT QUANTIZED COEFFICIENT DATA. In FIG. 5, this data is COEFF input into A Times B 510. As each new column is addressed in the Column Buffer, a bit is added to the current block buffer of four registers keeping track of which columns for this block have data. If the Huffman data is 0x00 or k is greater then 63 then this is the end of a block and nothing is stored, the k is set to zero and a new block is started.

The CB1:4 registers are used by the erase logic to determine which of the 32 addresses (e.g. four blocks of eight columns) in the Column Buffer to erase. The Erase Buffer Controls will begin the erase process as soon as the Column IDCT and Store indicates it has completed that block. Using the data in the released block's register CB1/2/3/4 it will erase the data clearing the buffer and releasing it to the storage logic for a new block to be written.

An IDCT algorithm such as is found in Figure 4-8 on page 52 of the above-incorporated JPEG book by Pennebaker and Mitchell is first done reading the dequantized data for a column. The F(N) in the equations are actually the input as decompression goes from right to left whereas compression is from left to right. The results of this are stored in the Row Buffer 196 (see FIG. 1) which has room for four blocks of data. Since every location is stored for a block there is no erase associated with this buffer. So that the same logic can be used for the row data, the data is stored incrementing bits 5-3 where bit 0 is the least significant bit, so 3 is the binary number B'1000'=decimal 8 (i.e. the output of the column IDCT is positioned with a stride of 8 so it will be ready for the row IDCT). This logic is then used as the row output with the final output modified to present only the bits 19:12 (e.g. in software, this would be a shift right by 12: in hardware this is accomplished by having the 12 bits numbered 11-0 are not output) removing the 12 bits added to the Quantization table while converting it to a scaled quantization table. Note that assumes a particular scaling convention. Those skilled in the art would know how to remove the correct number of bits for other scaling conventions. The data is rounded up dependent on bit 11. This data is the reconstructed data, and is presented one byte per clock cycle. In order to accomplish this, the multiplies and adds of the algorithm shown in Figure 4-8 on page 52 of the above-incorporated Pennebaker and Mitchell text are pipelined in the above algorithm with four stages of registers and state machines. Details of other fast efficient scaled IDCTs can be found in "A Fast and Accurate Inverse Discrete Cosine Transform" by Hinds and Mitchell; Proceedings of the IEEE Workshop on Signal Processing Systems; Athens, Greece, pp. 87-93, Nov. 1-3, 2005 which is also fully incorporated by reference.

In view of the foregoing, it is seen that the invention provides on-the-fly address generation for access into the Huffman table without requiring a large look-up table and does so very rapidly since the code word length is determined in parallel and simultaneously with the computation of an address in a pipelined fashion in three clock cycles. The data shifting for determining the length of the next code word can be initiated as soon as the length of the current code word is determined. Further, since, for a given code word, using a multiplexer to select the index for the N-bit code word (determined in the first cycle so that the decoded symbol can be output at the end of the second cycle while the N compressed bits are discarded by shifting and the next left adjusted bits aligned. One-bit and two-bit codes can be special cased in multiplexer 450 the development of an address can be accomplished in one or two clock cycles, respectively. Specifically recognizing the DC diff=0 and AC EOB or AC ZRL codes if they occur with a one-bit "0" will allow one bit codes to be handled in one cycle and recognizing AC EOB, AC ZRL and DC diff=0 two-bit codes allows two-bit codes to be handled in two cycles. All other length code words are handled in a maximum of three cycles. Additionally, the low order four bits of the decoded symbol, which are the size value, is also available at that time (the end of the second cycle) to control handling of the extra bits needed to reconstruct the non-zero transform coefficient. Thus, the invention provides for use of available FPGAs to not only provide addressing into the Huffman tables or corresponding tables in accordance with other compression techniques but supports doing so in a minimum number of clock cycles through parallel operations being performed in a pipelined fashion and thus achieves substantial acceleration of the decoding process well beyond that which can be achieved by increase of clock rate.

In the drawings and specifications there has been set forth a preferred embodiment of the invention and, although specific terms are used, the description thus given uses terminology in a generic and descriptive sense only and not for purposes of limitation. While the invention has been described in terms of a single preferred embodiment, those skilled in the art will recognize that the invention can be practiced with modification within the spirit and scope of the appended claims.

The invention claimed is:

1. Apparatus comprising
a field programmable gate array (FPGA) programmed to form components for performing steps of
receiving an input stream of bits,
performing a comparison to determine code word length,
performing an addition of an offset and a number of bits of said bit stream in parallel with said step of performing a comparison,
selecting a result of said step of performing an addition, and
discarding a number of bits of said bit stream equal to said length of said code word upon completion of said step of performing a comparison.

2. Apparatus as recited in claim 1, wherein said comparison is performed on least significant bits of said number of bits of said bit stream and said selecting step is performed partially in response to high order bits of said number of bits of said bit stream.

3. Apparatus as recited in claim 1, wherein said number of bits of said bit stream is equal in number to a maximum number of bits of a said code word.

4. Apparatus as recited in claim 1, wherein said FPGA is programmed to perform a further steps of storing and selecting between binary words used for comparison with bits of said bit stream.

5. Apparatus as recited in claim 1, wherein said FPGA is programmed to perform further steps of storing and selecting between offsets used for addition to bits of said bit stream.

6. Apparatus as recited in claim 1, wherein a result of said step of selecting a result of said step of performing an addition addresses a memory.

7. Apparatus as recited in claim 6, wherein said memory includes both DC and AC tables.

8. Apparatus as recited in claim 7, wherein said DC and AC tables are limited to 256 or less entries for baseline JPEG decoding.

9. Apparatus as recited in claim 1, wherein said FPGA is programmed to include logic for special casing of one-bit and two-bit code word lengths.

10. Apparatus as recited in claim 1, wherein said FPGA is programmed to select bits of said bit stream as extra bits.

11. A method of decompressing compressed data, said method including steps of
receiving an input stream of bits,
performing a comparison to determine code word length,
performing an addition of an offset and a number of bits of said bit stream in parallel with said step of performing a comparison,
selecting a result of said step of performing an addition, and
discarding a number of bits of said bit stream equal to said length of said code word upon completion of said step of performing a comparison.

12. A method as recited in claim 11, wherein said comparison is performed on least significant bits of said number of bits of said bit stream and said selecting step is performed partially in response to high order bits of said number of bits of said bit stream.

13. A method as recited in claim 11, wherein said number of bits of said bit stream is equal in number to a maximum number of bits of a said code word.

14. A method as recited in claim 11, including further steps of storing and selecting between binary words used for comparison with bits of said bit stream.

15. A method as recited in claim 11, including further steps of storing and selecting between offsets used for addition to bits of said bit stream.

16. A method as recited in claim 11, wherein a result of said step of selecting a result of said step of performing an addition addresses a memory.

17. A method as recited in claim 16, wherein said memory includes both DC and AC tables.

18. A method as recited in claim 17, wherein said DC and AC tables are limited to 256 entries for baseline JPEG decoding.

19. A method as recited in claim 11, wherein said FPGA is programmed to include logic for special casing of one-bit and two-bit code word lengths.

20. Apparatus as recited in claim 11, including a further step of selecting bits of said bit stream as extra bits.

* * * * *